(12) United States Patent
Hwang et al.

(10) Patent No.: US 7,382,844 B2
(45) Date of Patent: Jun. 3, 2008

(54) METHODS TO SELF-SYNCHRONIZE CLOCKS ON MULTIPLE CHIPS IN A SYSTEM

(75) Inventors: Charlie C. Hwang, Wappinger Falls, NY (US); Timothy G. McNamara, Fishkill, NY (US); Ching-Lung Tong, Highland Mills, NY (US); Wiren Dale Becker, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 540 days.

(21) Appl. No.: 11/056,767

(22) Filed: Feb. 11, 2005

(65) Prior Publication Data

US 2006/0182214 A1 Aug. 17, 2006

(51) Int. Cl.
*H04L 7/00* (2006.01)

(52) U.S. Cl. .................. 375/354; 327/141; 358/409; 358/405; 358/406; 358/407; 358/408; 370/503; 713/400; 714/12

(58) Field of Classification Search .............. 375/359
See application file for complete search history.

(56) References Cited

U.S. PATENT DOCUMENTS

| 6,470,458 B1 * | 10/2002 | Dreps et al. ............... 713/400 |
| 6,751,248 B1 * | 6/2004 | Tan ............................ 375/132 |
| 7,174,475 B2 * | 2/2007 | Lee et al. .................... 713/503 |

\* cited by examiner

*Primary Examiner*—Shuwang Liu
*Assistant Examiner*—Dhaval Patel
(74) *Attorney, Agent, or Firm*—Lynn L. Augspurger; Richard M. Goldman

(57) ABSTRACT

A method of self-synchronizing clocks in a multiple chip system, by assigning one chip as the master chip and the other chips as slave chips. A training signal is sent from master chip to the slave chips to determine the latency from the master chip to a slave chip, and then a synchronization signal is sent out to synchronize the "time zero" of the chips.

3 Claims, 8 Drawing Sheets

Multi-chip self-sync methods

Prior art #2: If the spread of travel time of sync signals is within one reference clock cycle, delay sync_out.

Multi-chip self-sync methods

Digital calibration

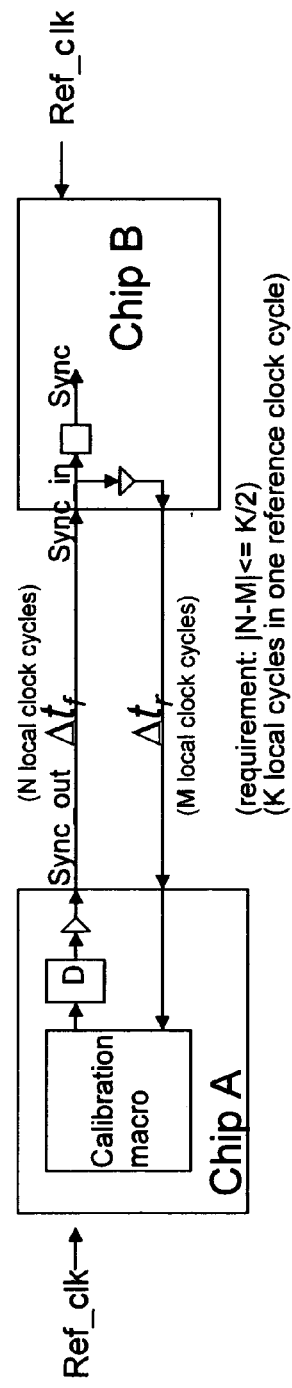

Step 1: Measure roundtrip delay. Set D=0. A sync pulse is sent from chip A to chip B. When chip B receive the pulse, it returns a pulse back to A. Chip A times the total round-trip delay. (In this example, assuming N+M local cycles)

Step 2: Calculate appropriate values of D and I in (N+M)/2+D=(I+0.5)*K

Step 3: Launch sync pulse from calibration macro I+1 reference clock cycles before intended sync timing.

Figure 5

Multi-chip self-sync methods

Enhancement: Digital calibration w/o package design constraints

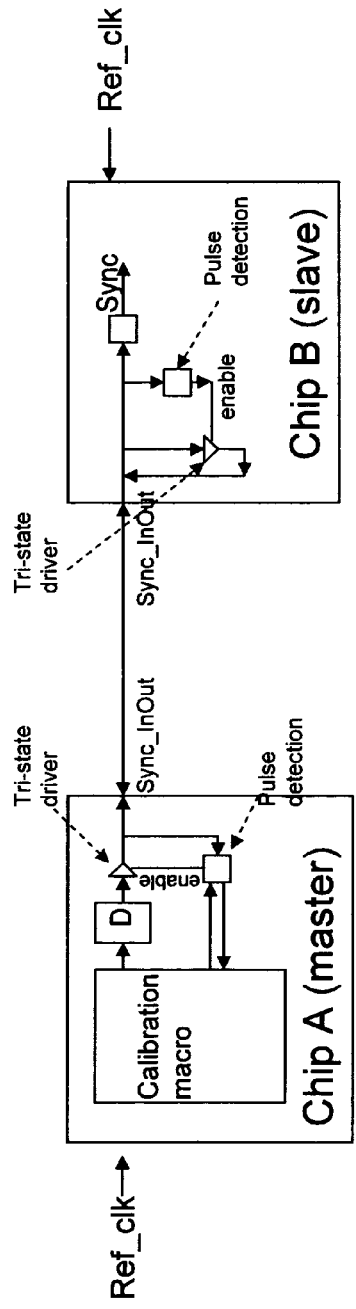

The packaging design requirement of matching sending and returning path of the sync pulse may be removed by using tri-state driver and sharing sending and returning path.

The uncertainty left will be
1. Difference driving strength of drivers on chip A & C.
2. Sync pulse lands around local clock edge. Uncertainty of 1 local clock cycle.
3. Skew between reference clocks on chip A and B.

Figure 7

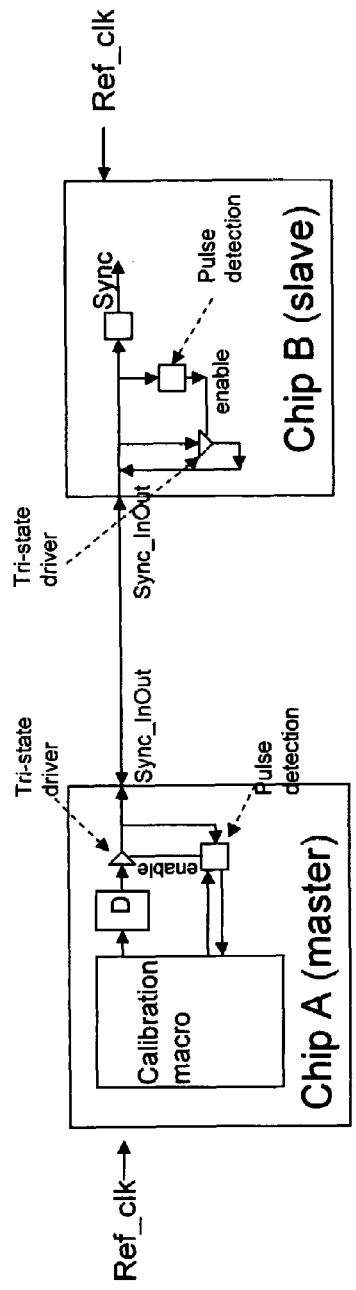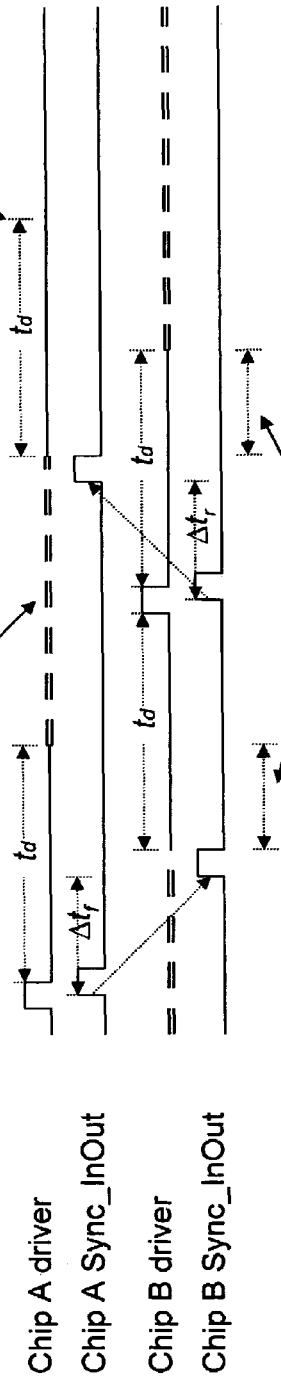
Figure 8

METHODS TO SELF-SYNCHRONIZE CLOCKS ON MULTIPLE CHIPS IN A SYSTEM

BACKGROUND

1. Field of the Invention

The invention relates to methods to self-synchronize clocks on multiple chips in a system 2. Background Art A synchronous digital system consists of multiple chips that run on reference clocks with known relationship. Typically there are cross-chip functions that require the "time-zero" on each chip to be synchronized for the functions to work properly.

In a multi-chip system, such as shown in FIG. 1, to synchronize all chips with each other without external controls, one chip may be temporarily assigned as the "master" chip. The rest of the chips will be "slave" chips. After a system is powered on, the master chip may start to send out synchronization signals to synchronize the "time-zero" of all slave chips and itself. The "time-zero" events usually are repeating with very long cycles. The timing of "time-zero" is typically aligned to the reference clock boundary assuming all chips are receiving the same reference clocks with reasonable skew or known deterministic skew. If all chips are placed close together and a synchronization signal sent from one chip can arrive at another within one reference clock cycle, the "master" chip may simply send out the synchronization signals one reference clock cycle before the intended time-zero. Once the signals arrive at destination chips, all chips can set their "time-zero" to the following rising edge of the reference clock. If the reference clocks for all the chips are not identical, protocols for "time-zero" may be easily determined as long as the relationships and skews among all reference clocks are known. One synchronization signal may be shared among several chips if needed.

In a system with long distances among chips and short reference clock cycle, as shown in FIG. 2, synchronization signals may take multiple reference cycles to reach the destination chips depending on the actual path lengths and packaging/chip process variations. The simple synchronization approach described above no longer guarantee successful synchronization among all chips, since each chip may need different number of reference cycle to receive the synchronization signals. New approaches to account for all possible situations will be required.

Note that in FIG. 3 Chip B and C are not synchronized to the same reference clock cycle.

In a simplified situation, as shown in FIG. 4, all the chips under consideration are still close together and the difference between the maximum and minimum latency for sending synchronization signals from one chip to another may be less than one reference clock cycle with all packaging/chip process variations considered. Additional time may be added prior to sending out synchronization signals so the synchronization signals arrived at all chips within the same reference clock boundaries. But this approach still has the same limitation as the original approach in term of system size and package/process variations. Additional work on package design may be required to match the latencies of synchronization signals among all chips, which may not feasible in larger systems.

SUMMARY OF THE INVENTION

The invention described herein provides methods for chips to synchronize their "time-zero" with each other without an additional external control chip. The disclosed methods work at wider range of situations and have less constraints on packaging design then prior art designs.

To remove the limitation on chip-to-chip communication latency matching and to account for various package variations, a simple set of training procedures may be applied prior to sending out synchronization signals to determine the actual latency from one master chip to a slave chip. The information is then applied to the timing of the synchronization signal for that particular slave chip. Since the latency between the master chip and each slave chip is individually measured, the timing of the synchronization signals to each slave chip may be individually adjusted. Any mismatch in the wiring path on the package for the synchronization signals will be accounted for in the proposed procedures. This is also true for package variations.

The main advantage of this invention is to enable the synchronization across chips in larger system that have synchronization signal latencies of different numbers of reference clock cycles. This situation can not be resolved in the approaches mention in the prior arts. Another advantage is to reduce the risk and requirement from packaging design, which is usually not as precise as the chip design. If lower quality packages are used, large variations of latency from one package to another may be accounted for with this invention. An additional advantage is that when a new packaging design is used with the same chips, no new packaging analysis is required. This is particularly helpful when the packaging design is done by less proficient customers.

THE FIGURES

FIG. 5 is a high level illustration of a multi-chip self synchronization method using digital calibration.

FIG. 7 illustrates a design using a tri-state driver and sharing the sending and receiving path.

FIG. 8 illustrates a design where the driver is disabled to prevent the bi-directional line from being floated.

DETAILED DESCRIPTION

Figure 1:
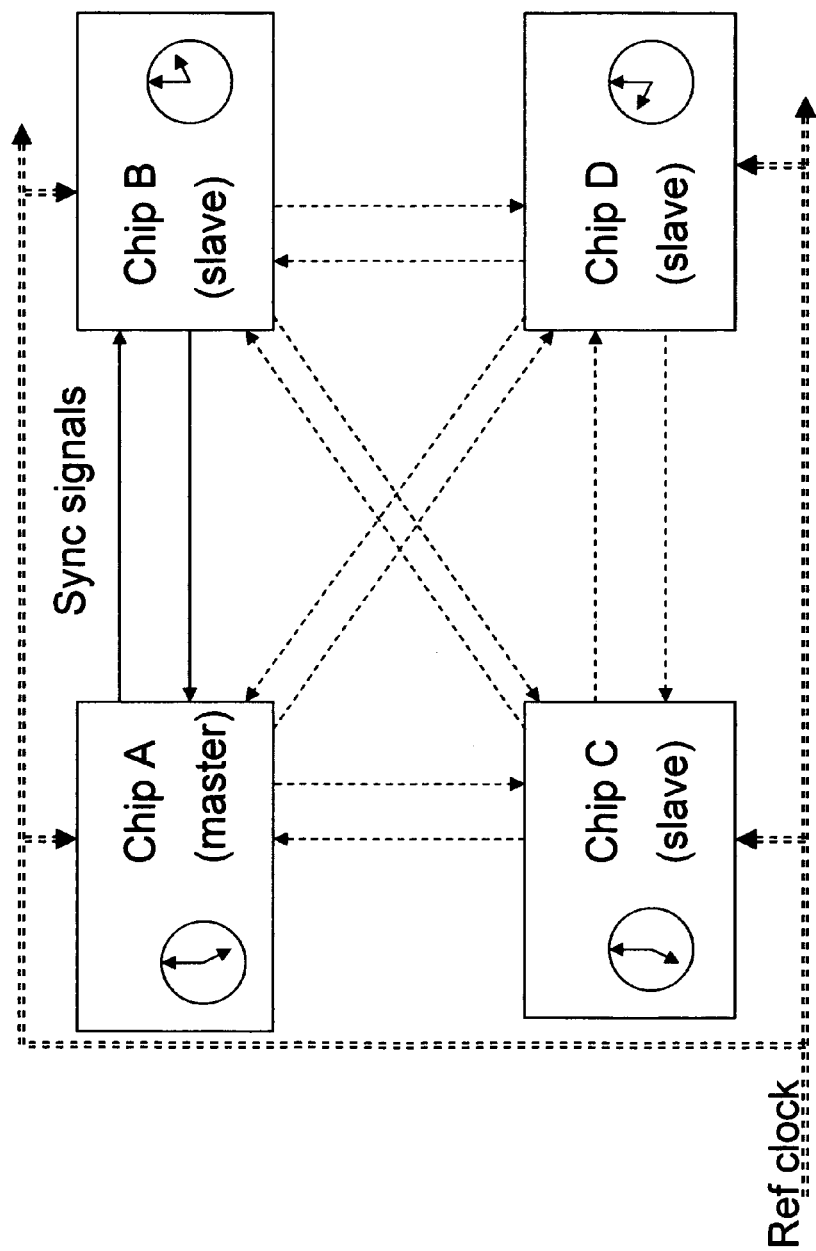
FIG. 1 is a high level view of a multi-chip system, showing multi-chip clock synchronization methods.
Figure 2:
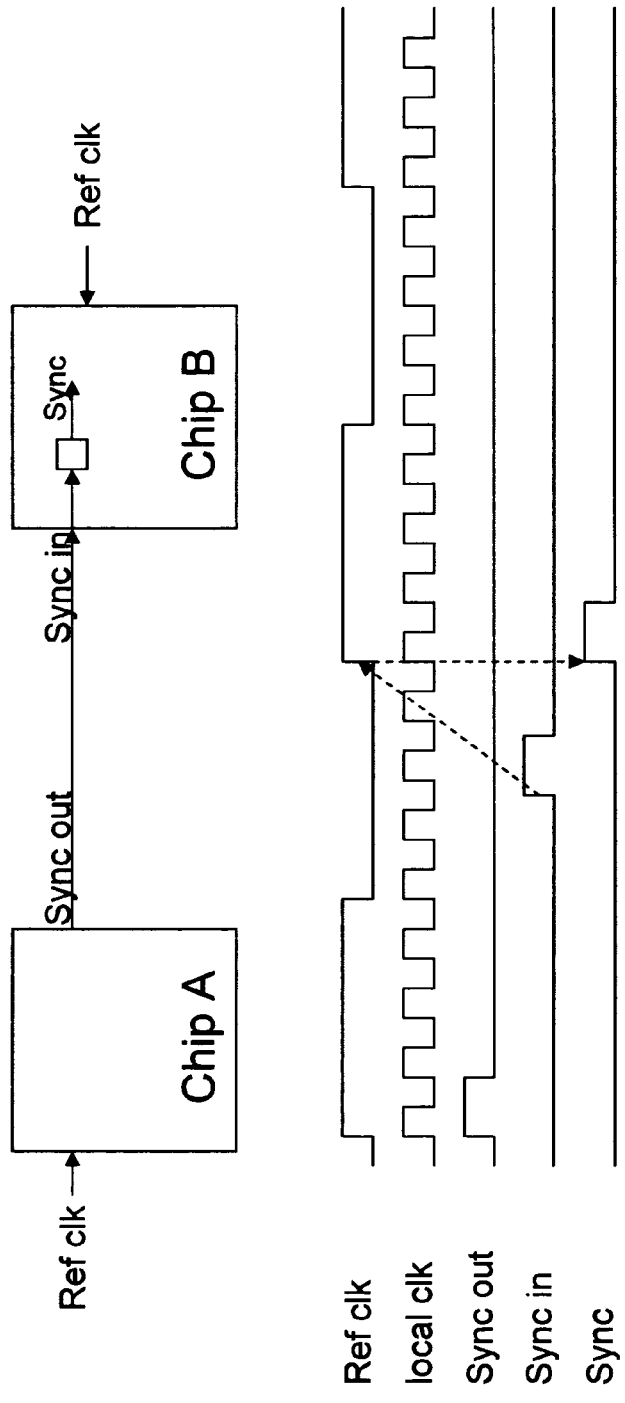
FIG. 2 is a high level view of a multi-chip system of the prior art illustrating synchronization signals traveling from one chip to another within one reference clock signal.
Figure 3:
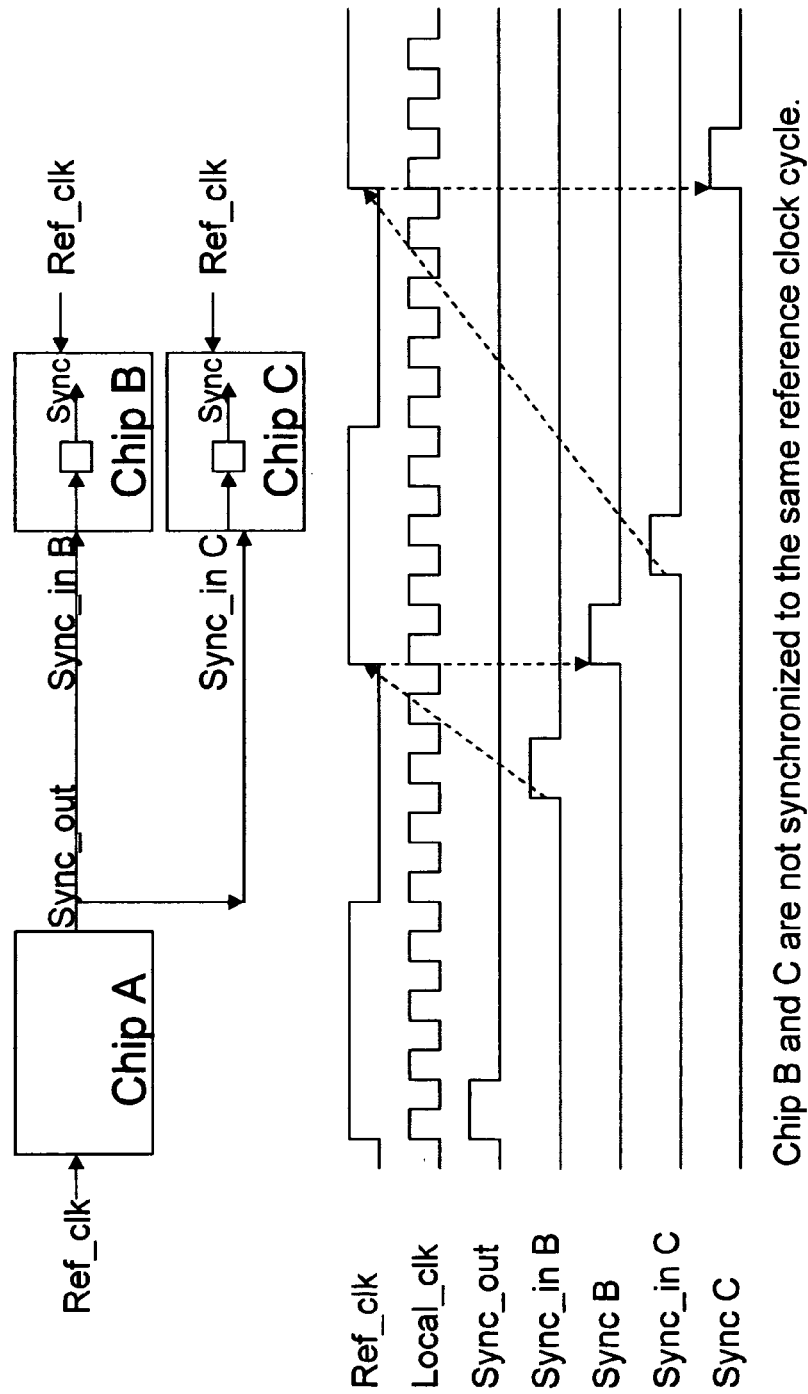
FIG. 3 is a high level view of a multi-chip system of the prior art illustrating synchronization signals traveling from one chip to another requiring more then one reference clock signal.
Figure 4:
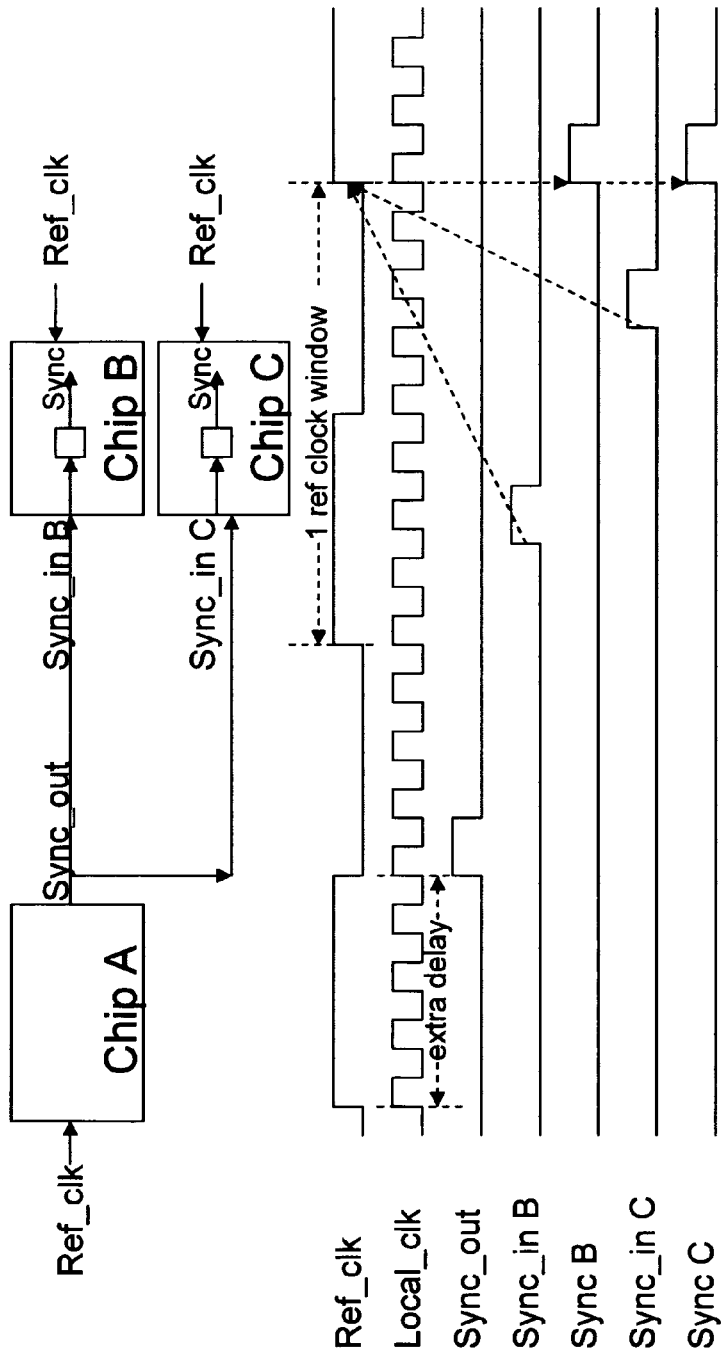
FIG. 4 is a high level view of a multi-chip system of the prior art illustrating synchronization signals traveling from one chip to another within one reference clock signal, with delay synch out.

The sample system used to describe this invention is similar to the one described in the prior art. There are multiple chips (4 chips shown in FIG. 1) in the system. All chips are assumed to be equivalent. Any of the chip may be assigned as the master chip before the synchronization process start. There is a pair of paths for synchronization signals between any of the two chips so any of the chip may be assigned to be the master chip.

Typically local clocks with higher frequencies are generates with on-chip PLL's. The local clock on the master chip is used for the measurement of the latency of synchronization signals. In the timing diagrams, the local clock has a frequency 8 times higher than the reference clock. The synchronization process in this invention includes the following:

a. A master chip is assigned to determine "time-zero" and to generate syncrhonization signals. (Chip A in this example). The ratio between the frequencies of the local clock on chip A and the reference clock is assumed to be K.

b. A delay calibration macro, which controls the following procedures, is built on each chip, as shown in FIG. 5. A programmable delay element is placed between the synchronization output from the macro and the IO of chip A. D, in term of local clocks, is assume to be the delay programmed into the programmable delay element. During training period, D is first set to zero. A training pulse is then sent out from chip A to chip B. As soon as chip B receives the pulse, it returns a pulse back to chip A. The total round-trip delay is measured at the master chip, A, using local clock on chip A. Assuming the delay from chip A to chip B is .t, and .t from chip B to chip A.

The total round trip delay will be ($\Delta t_t + \Delta t_r$).

Assuming the measured round trip delay is N local clock cycles, which corresponds to delay ($\Delta t_t + \Delta t_r$).

c. One requirement for this approach to work is that $\Delta t_t$ and $\Delta t_r$ can not differ too much. This not hard to achieve since these two paths may be designed like a differential pair on the package. If these two latencies are similar, the one-way latency will be approximately N/2 local clock cycles. Assuming the proper delay at the programmable delay element is D. The one-way delay from chip A to chip B with the proper delay, D, will be (N/2+D) local clocks. To avoid ambiguity of which reference clock edge chip B will synchronize to, it's best that the synchronization signals arrive the slave chip at the mid-cycle of the reference clock. That will make the total delay including the programming delay element to be (I+0.5)*K. "I" can be any integer. So we arrived at the following equation to solve. N/2+D=(I+0.5)*K N is measured. K is given. I can be any integer. So D can be determined from this equation with a given I. In general, I should be chosen to be as small as possible.

d. Repeat b to c for chip C and chip D in parallel or in series with the training process for chip B.

e. For chip B, the programmable delay is set to "D" determined in step c. The synchronization signal is sent out from the calibration macro (I+1)*K local clock cycle (or I+1 reference cycle) before intended time-zero. Same thing for all other slave chips. If each slave chip has its own programming delay element, then all slave chips may be synchronized at the same time.

EXAMPLE

K=8

N=18.8 measured from step b $N/2+D=(I+0.5)*K$ $9.4+D=(I+0.5)*8$

D=2,I=1

Figure 6:
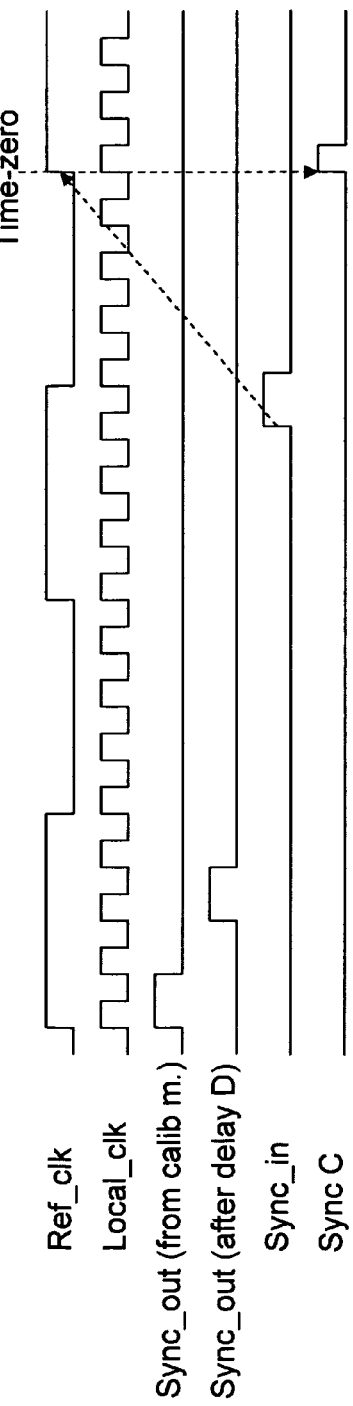
FIG. 6 is a continuation of the view shown in FIG. 5 of a multi-chip self synchronization method using digital calibration where the sync pulse is launched (1+1) reference cycles before the intended synch timing.

As seen in FIG. 6, synchronization pulse is sent out 2 reference cycles before time-zero, while the programmable delay element is set to 2.

Since the synchronization pulses are targeted to arrive at the slave chip at mid-cycle, uncertainty of about K/2−1 local clock cycles may be tolerated. That will translate into K−2 local clock cycles for the allowable mismatch between $\Delta t_t$ and $\Delta t_r$. This alleviates the requirement on the packaging design for the sending and returning path from the master chip to a given slave chip.

To reduce the potential mismatch between the driving strength of the IO drivers on the master and slave chips, drivers should be chosen to have good slew so majority of the delay will be from wiring on the package.

To remove the requirement of roughly matched sending and returning paths of synchronization signals, one bi-directional path can be shared by both sending and receiving paths using tristate drivers as shown in the FIG. 7.

The tri-state driver control procedures are listed below.

a. At the beginning of the training period, the driver on chip A is enabled. The driver on chip B is disabled. A training pulse is sent from chip A and arrive at chip B after a certain delay. After the pulse is sent, the driver on chip A is turned off. A small drain device at the driving end may be used to keep the line from being floating.

b. The pulse detection circuit on chip B detect the pulse and turn on the driver on chip B. A pulse is returned back to chip A, overpowered the drain device on chip A. The driver on chip B is turned off after sending the pulse.

c. The pulse detection circuit on chip A detects the pulse, send a pulse to calibration macro to calculate timing as described previously.

Since there is a dead time between step a and step b when no driver is driving the bidirectional line, the small drain device may not be sufficient to keep the line from being floating, which may create false signals, depending on the wire length and clock speed. In addition, there may be ringing from IO that may affect pulse detection if the driver is shut off too early. To resolve these issues, a large delay may be added after a driver on either chip sends out the synchronization pulse before the driver is disabled. During the delay, the line will properly discharge. The delay should be chosen to be larger than any one-way transition time between any two chips by a large margin. The exact number of the delay is not critical. The delay may be implemented with a counter in the pulse detection circuit, which control the tri-sate drivers. The amount of delay may be specified in number of local clock cycles and pre-programmed into all the chips before the training starts. The control sequences with the added delay will be the following:

a. The driver on chip B is disabled initially. A training pulse is sent out from chip A, whose driver is enabled. After the pulse is sent, the driver on chip A continue to drive the line low for the chosen delay, t. After the delay, the tri-state driver on chip A is disabled.

b. When the pulse detection circuit on chip B detects a training pulse, it will turn on the driver on chip B immediately but only drive the line to low. Then after the chosen delaytd, the pulse detection circuit will make the tri-state driver to generate a returning training pulse to be sent back to chip A. The driver on chip B continue to drive the line low for the same delay time, td, like in step a before it's disabled.

c. When chip A receives the returned training pulse, it will calculated the timing as described before with the additional delay, t, considered.

d. And chip A will also turn its driver on to take control of the line but only drive it low until the real synchronization pulse is ready to be sent.

Similar to step b, the next synchronization pulse should also wait at least the same delay time, td, after the return pulse is received to avoid conflict.

So in this arrangement, instead of having a period of dead time when the line is floating, there is a overlap time when both driver on chip A and B are driving the line low. The delay, td, should be chosen to be larger than the transit time, $t_r$ or $tr$ between any two chips to guarantee that the bi-directional line is always driven. The actual number chosen for the delay is not important.

The chip driver may be periodically disabled, as shown in FIG. 8. Since chip B does not know which pulse is for training and which is for synchronization, the slave chip B should treat all the pulses as synchronization pulses and should always return a pulse to the master chip upon receiving a pulse. Both chips should always follow the protocols described above in controlling the bi-directional line to avoid any conflict. Dotted lines mean the driver is disabled. Next pulse may be Chip A driver As illustrated in FIG. 8, Chip A Sync_InOut Chip B driver Chip B Sync_InOut Both Chip A & B drivers enabled In a hot-plugged system, any of the chips may be added or removed at any time. If a new chip is added, the originally assigned master chip may initiate a synchronization process just for that new chip. If the master chip is removed, a new master chip should be assigned. The new master chip may use the original time-zero timing to synchronize any new chip added afterward.

While our invention has been described with respect to certain preferred embodiments and exemplifications, it is not intended to limit the scope of the invention thereby, but solely by the claims appended hereto.

We claim:

1. A method of self synchronizing clocks in a multiple chip system, comprising:
   a) assigning one chip as a master chip and other chips as slave chips;
   b) training a chip by a method comprising:
      i) enabling a driver on a first chip and disabling a driver on a second chip at a beginning of a training period;
      ii) sending a training pulse from the first chip to the second chip to arrive at the second chip after a certain delay;
      iii) turning off the driver on the first chip;
      iv) detecting the pulse on the second chip, and turning on the driver on the second chip to return the pulse back to the first chip;
      v) turning off the driver on the second chip after the pulse has been sent;
   c) sending out a training signal from the master chip to the slave chips to determine latency from the master chip to a slave chip;
   d) sending out a synchronization signal to synchronize a "time zero" of the master and slave chips and
   e) after the pulse is sent, and the driver on the first chip is turned off, a drain device at a driving end keeps a line from floating by adding a delay before disabling the driver on the first chip, the added delay is chosen to be larger than any one way transition time between the first chip to the second chip or from the second chip to the first chip by a large margin.

2. The method of claim 1 wherein an individual chip has a high frequency PLL, and higher frequency clock signals are generated on the chip.

3. The method of claim 1 wherein individual chips have a delay macro, and a programmable delay is placed between the delay macro and a chip IO.

* * * * *